United States Patent
Cheng et al.

(10) Patent No.: US 9,761,622 B2
(45) Date of Patent: Sep. 12, 2017

(54) CMOS IMAGE SENSOR STRUCTURE WITH CROSSTALK IMPROVEMENT

(71) Applicant: TAIWAN SEMICONDUCTOR MANUFACTURING CO., LTD., Hsinchu (TW)

(72) Inventors: Yun-Wei Cheng, Taipei (TW); Chun-Hao Chou, Tainan (TW); Tsung-Han Tsai, Miaoli County (TW); Kuo-Cheng Lee, Tainan (TW); Volume Chien, Tainan (TW); Yung-Lung Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/849,311

(22) Filed: Sep. 9, 2015

(65) Prior Publication Data
US 2017/0069678 A1    Mar. 9, 2017

(51) Int. Cl.
*H01L 31/0232* (2014.01)
*H01L 27/146* (2006.01)

(52) U.S. Cl.
CPC .... *H01L 27/14636* (2013.01); *H01L 27/1462* (2013.01); *H01L 27/14621* (2013.01); *H01L 27/14627* (2013.01); *H01L 27/14685* (2013.01)

(58) Field of Classification Search
CPC .......... H01L 27/14636; H01L 27/1462; H01L 27/14621; H01L 27/14627; H01L 27/14685
See application file for complete search history.

(56) References Cited

U.S. PATENT DOCUMENTS

| | | | |
|---|---|---|---|
| 2013/0241018 A1* | 9/2013 | Jangjian | H01L 27/14621 257/432 |
| 2013/0320469 A1* | 12/2013 | Tseng | H01L 27/14603 257/431 |
| 2015/0303233 A1* | 10/2015 | Borthakur | H01L 27/14636 348/273 |
| 2015/0372030 A1* | 12/2015 | Cheng | H01L 27/1462 257/432 |

* cited by examiner

*Primary Examiner* — Victor A Mandala
*Assistant Examiner* — Colleen E Snow
(74) *Attorney, Agent, or Firm* — Maschoff Brennan

(57) ABSTRACT

A semiconductor device includes a substrate, a device layer, a composite grid structure, a passivation layer and color filters. The device layer overlies the substrate. The composite grid structure overlies the device layer. The composite grid structure includes cavities passing through the composite grid structure, and the composite grid structure includes a metal grid layer and a dielectric grid layer stacked on the metal grid layer. The passivation layer conformally covers the composite grid structure. The color filters respectively fill the cavities.

20 Claims, 13 Drawing Sheets

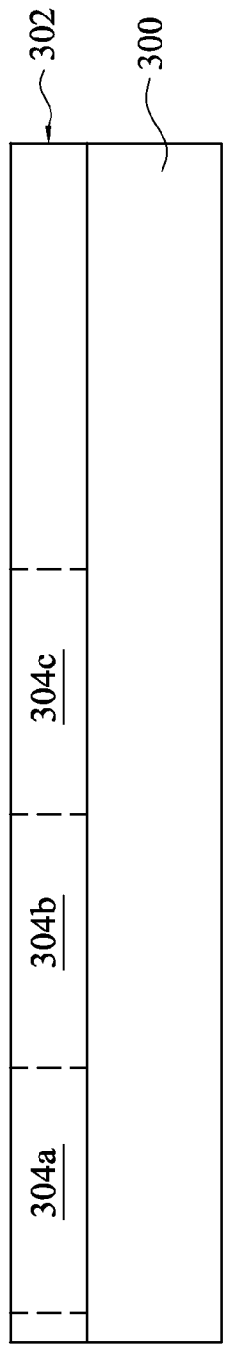
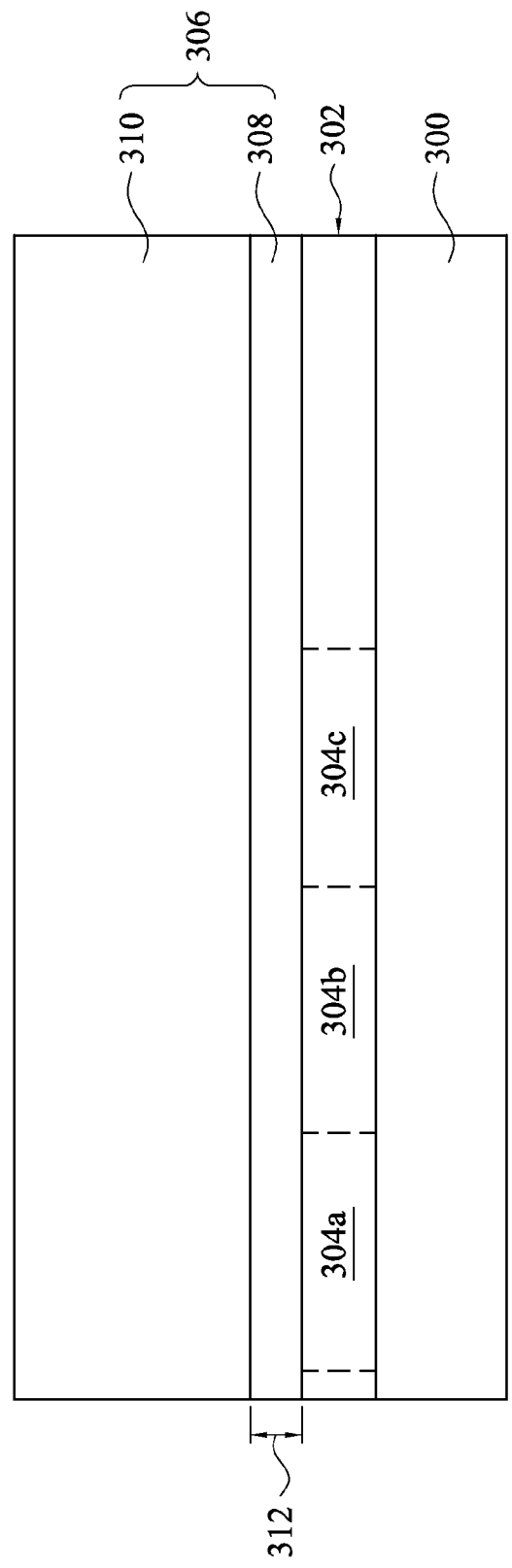
FIG. 3A
FIG. 3B

CMOS IMAGE SENSOR STRUCTURE WITH CROSSTALK IMPROVEMENT

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Front side illuminated (FSI) CMOS image sensors and back side illuminated (BSI) CMOS image sensors are two types of CMOS image sensors. The FSI CMOS image sensors are operable to detect light projected from their front side while the BSI CMOS image sensors are operable to detect light projected from their backside. The BSI CMOS image sensors can shorten optical paths and increase fill factors to improve light sensitivity per unit area and quantum efficiency, and can reduce cross talk and photo response non-uniformity. Hence, the image quality of the CMOS image sensors can be significantly improved. Furthermore, the BSI CMOS image sensors have high chief ray angles, which allow shorter lens heights to be implemented, so that thinner camera modules are achieved. Accordingly, the BSI CMOS image sensor technology is becoming a mainstream technology.

However, conventional BSI CMOS image sensors and methods of fabricating the BSI CMOS image sensors have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 3E are schematic cross-sectional views of intermediate stages showing a method for manufacturing a semiconductor device in accordance with various embodiments.

DETAILED DESCRIPTION

Figure 1:
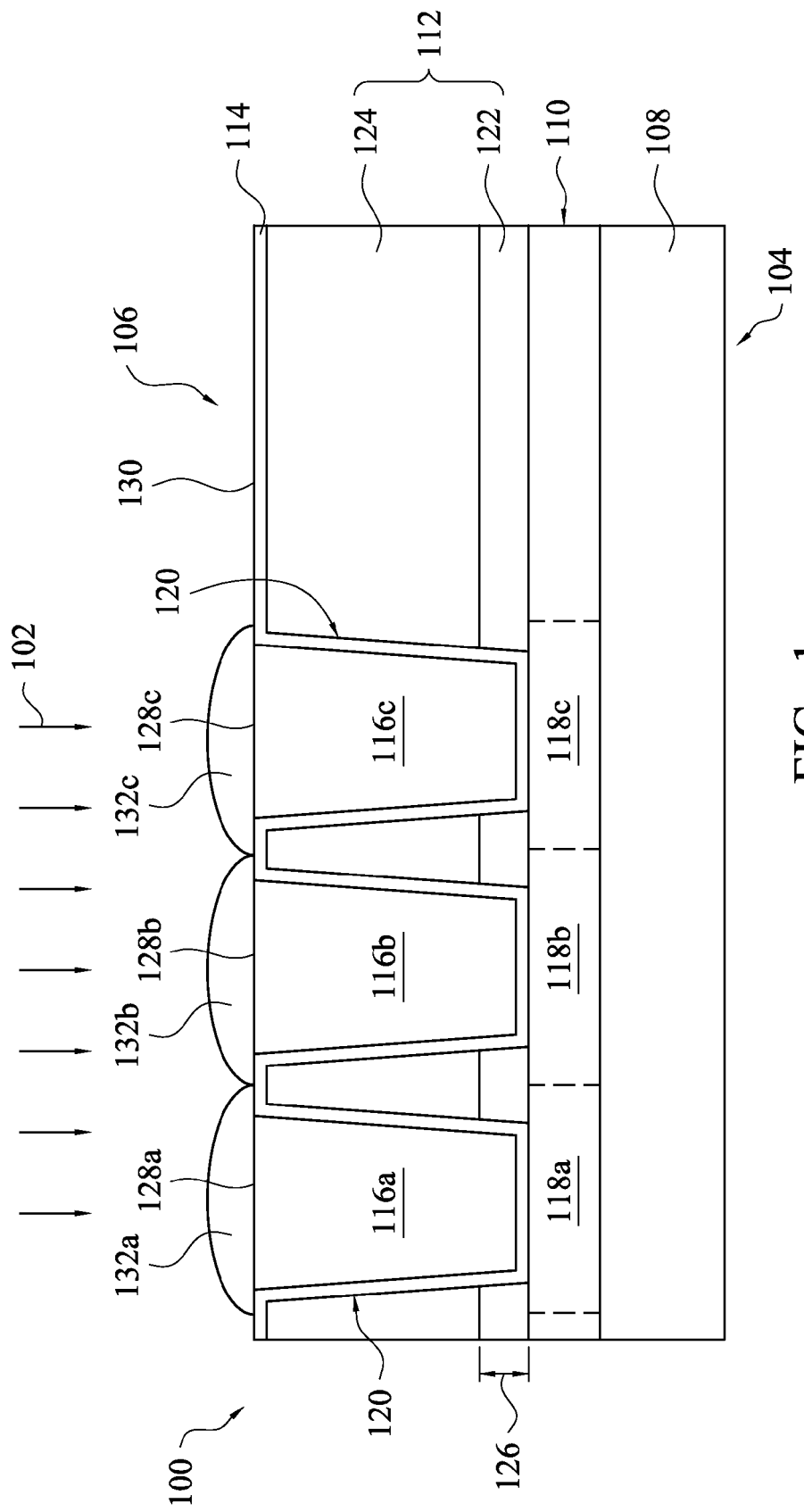
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical BSI CMOS image sensor, a metal grid is disposed on a device layer, and an etching stop layer and a dielectric grid are sequentially disposed over the metal grid, in which a passivation layer is needed to be disposed between the etching stop layer and the metal grid for separating the metal grid from color filters filling cavities to prevent the color filters from corroding the metal grid, in which the cavities are formed in the dielectric grid and the etching stop layer. However, the existence of the passivation layer increases the thickness of the BSI CMOS image sensor. In addition, the passivation layer does not have light confinement ability and forms an optical crosstalk path, thus worsening optical crosstalk of the BSI CMOS image sensor.

Embodiments of the present disclosure are directed to providing a semiconductor device and a method for manufacturing the semiconductor device, in which a dielectric grid layer is directly disposed on a metal grid layer to form a composite grid structure, and a passivation layer conformally covers the composite grid structure, such that the thickness of the semiconductor device is reduced, and light is effectively blocked by the composite grid structure from diffusing to adjacent photoelectric devices. Thus, quantum efficiency of the semiconductor device is increased due to a shorter path of the light while a crosstalk effect and an image quality of the semiconductor device are greatly improved.

FIG. 1 is schematic cross-sectional view of a semiconductor device in accordance with various embodiments. In some embodiments, a semiconductor device 100 is a CMOS image sensor device, which may be operated for sensing incident light 102. The semiconductor device 100 has a front side 104 and a back side 106. In some examples, the semiconductor device 100 is a BSI CMOS image sensor device, which is operated to sense the incident light 102 projected from its back side 106.

As shown in FIG. 1, the semiconductor device 100 includes a substrate 108, a device layer 110, a composite grid structure 112, a passivation layer 114 and various color filters, such as color filters 116a, 116b and 116c. The substrate 108 is a semiconductor substrate, and may be composed of a single-crystalline semiconductor material or a compound semiconductor material. For example, the substrate 108 is a silicon substrate. In some examples, germanium or glass may also be used as a material of the substrate 108.

The device layer 110 is disposed over the substrate 108. In some examples, a material of the device layer 110 includes silicon. For example, the material of the device layer 110 may include epitaxial silicon. The device layer 110 includes various photoelectric devices 118a, 118b and 118c. In some examples, the photoelectric devices 118a, 118b and 118c are photodiodes.

The composite grid structure 112 is disposed over the device layer 110. The composite grid structure 112 includes various cavities 120 which are formed in the composite grid structure 112 and pass through the composite grid structure 112, such that the cavities 120 expose a portion of the device layer 110. In some examples, as shown in FIG. 1, each cavity 120 has a cross-section in a shape of trapezoid. In certain examples, each cavity 120 has a cross-section in a shape of rectangle. The cavities 120 may be periodically arranged. A pitch between the cavities 120, a depth, a length and a width of each cavity 120 may be modified according to requirements of the semiconductor device 100.

In some examples, the composite grid structure 112 includes a metal grid layer 122 and a dielectric grid layer 124. The metal grid layer 122 is disposed over the device layer 110, and the dielectric grid layer 124 is stacked on the metal grid layer 122. The cavities 120 sequentially pass through the dielectric grid layer 124 and the metal grid layer 122. In some examples, the metal grid layer 122 is formed from metal or a metal alloy, such as tungsten or an aluminum-copper alloy. For example, the metal grid layer 122 may have a thickness 126 ranging from about 500 angstrom to about 5000 angstrom. In some examples, the dielectric grid layer 124 is formed from silicon oxide, silicon nitride or silicon oxynitride.

Referring to FIG. 1 again, the passivation layer 114 conformally covers the composite grid structure 112, such that the passivation layer 114 covers the exposed portion of the device layer 110. The passivation layer 114 is suitable for use in protecting the composite grid structure 112 from being corroded by the color filters 116a, 116b and 116c. In some examples, the passivation layer 114 is formed from silicon oxide, silicon nitride or silicon oxynitride.

The color filters 116a, 116b and 116c are disposed on the passivation layer 114, and respectively fill the cavities 120 of the composite grid structure 112. The color filters 116a, 116b and 116c may be arranged sequentially. In some exemplary examples, the color filters 116a, 116b and 116c include red color filters, blue color filters and green color filters. In some examples, as shown in FIG. 1, top surfaces 128a, 128b and 128c of the color filters 116a, 116b and 116c are elevated at the same level with a top 130 of the passivation layer 114.

In some examples, as shown in FIG. 1, the semiconductor device 100 may optionally include various micro lenses 132a, 132b and 132c. The micro lenses 132a, 132b and 132c respectively cover the top surfaces 128a, 128b and 128c of the color filters 116a, 116b and 116c.

The dielectric grid layer 124 is directly disposed on the metal grid layer 122 to form the composite grid structure 112, such that the thickness of the semiconductor device 100 is reduced, and light is effectively blocked by the composite grid structure 112 from diffusing to adjacent photoelectric devices since there is no additional layer between the metal grid layer 122 and the dielectric grid layer 124. Accordingly, quantum efficiency of the semiconductor device 100 is increased due to a shorter path of the light while a crosstalk effect and an image quality of the semiconductor device 100 are greatly improved.

Figure 2:
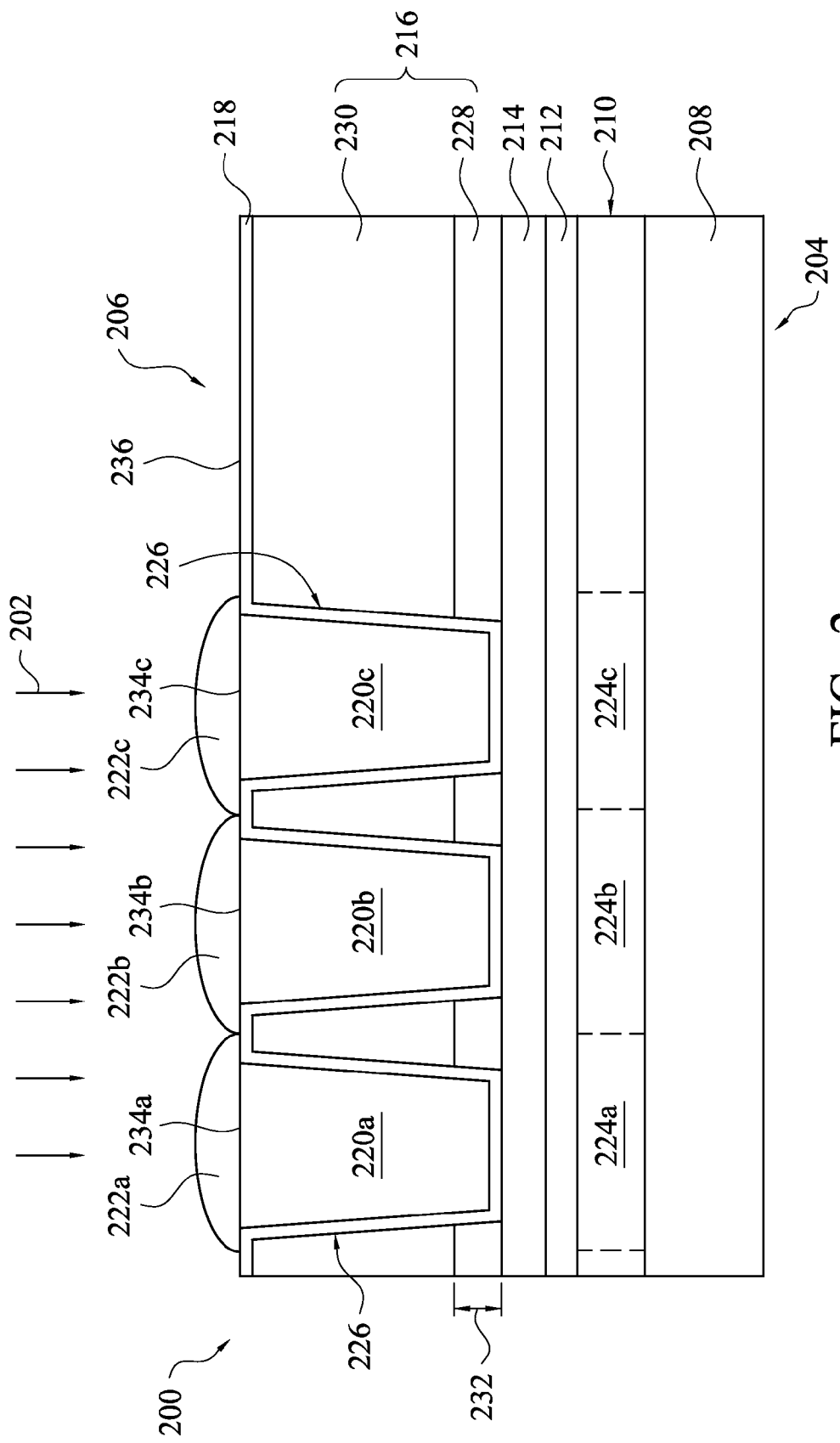
FIG. 2 is a schematic cross-sectional view of a semiconductor device in accordance with various embodiments.

FIG. 2 is schematic cross-sectional view of a semiconductor device in accordance with various embodiments. In some embodiments, a semiconductor device 200 is a CMOS image sensor device, which may be operated for sensing incident light 202. The semiconductor device 200 has a front side 204 and a back side 206. In some examples, the semiconductor device 200 is a BSI CMOS image sensor device, which is operated to sense the incident light 202 projected from its back side 206.

As shown in FIG. 2, the semiconductor device 200 includes a substrate 208, a device layer 210, an anti-reflective coating layer 212, a buffer layer 214, a composite grid structure 216, a passivation layer 218, various color filters and various micro lenses. In some examples, the semiconductor device 200 includes color filters 220a, 220b and 220c, and micro lenses 222a, 222b and 222c. The substrate 208 is a semiconductor substrate, and may be composed of a single-crystalline semiconductor material or a compound semiconductor material. For example, silicon, germanium or glass may be used as a material of the substrate 208.

The device layer 210 is disposed over the substrate 208. In some examples, a material of the device layer 210 includes silicon, such as epitaxial silicon. The device layer 210 includes various photoelectric devices 224a, 224b and 224c. In some examples, the photoelectric devices 224a, 224b and 224c are photodiodes.

Referring to FIG. 2 again, the anti-reflective coating layer 212 is disposed on the device layer 210 and covers the photoelectric devices 224a, 224b and 224c. The anti-reflective coating layer 212 is suitable for use in increasing the incident amount of light. The buffer layer 214 is disposed on the anti-reflective coating layer 212. The buffer layer 214 is suitable for use in increasing the adhesion of the composite grid structure 216 and the color filters 220a, 220b and 220c to the device layer 210.

The composite grid structure 216 is disposed on the buffer layer 214. The composite grid structure 216 includes various cavities 226 which are formed in the composite grid structure 216 and pass through the composite grid structure 216, such that the cavities 226 expose a portion of the buffer layer 214. In some examples, as shown in FIG. 2, each cavity 226 has a cross-section in a shape of trapezoid. In certain examples, each cavity 226 has a cross-section in a shape of rectangle. The cavities 226 may be periodically arranged. A pitch between the cavities 226, a depth, a length and a width of each cavity 226 may be modified according to requirements of the semiconductor device 200.

In some examples, the composite grid structure 216 includes a metal grid layer 228 and a dielectric grid layer 230. As shown in FIG. 2, the metal grid layer 228 is disposed on the buffer layer 214, and the dielectric grid layer 230 is stacked on the metal grid layer 228. The cavities 226 sequentially pass through the dielectric grid layer 230 and the metal grid layer 228. In some examples, the metal grid layer 228 is formed from metal or a metal alloy, such as tungsten or an aluminum-copper alloy. For example, the metal grid layer 228 may have a thickness 232 ranging from about 500 angstrom to about 5000 angstrom. In some examples, the dielectric grid layer 230 is formed from silicon oxide, silicon nitride or silicon oxynitride.

Referring to FIG. 2 again, the passivation layer 218 conformally covers the composite grid structure 216 and the exposed portion of the buffer layer 214. The passivation layer 218 is suitable for use in protecting the composite grid structure 216 from being corroded by the color filters 220a, 220b and 220c. In some examples, the passivation layer 216 is formed from silicon oxide, silicon nitride or silicon oxynitride.

The color filters 220a, 220b and 220c are disposed on the passivation layer 218 and respectively fill the cavities 226 of the composite grid structure 216. The color filters 220a, 220b and 220c may be arranged sequentially. In some exemplary examples, the color filters 220a, 220b and 220c include red color filters, blue color filters and green color filters. In some examples, as shown in FIG. 2, top surfaces 234a, 234b and 234c of the color filters 220a, 220b and 220c are elevated at the same level with a top 236 of the passivation layer 218. The micro lenses 222a, 222b and 222c respectively cover the top surfaces 234a, 234b and 234c of the color filters 220a, 220b and 220c.

By directly disposing the dielectric grid layer 230 on the metal grid layer 228 to form the composite grid structure 216, the thickness of the semiconductor device 200 can be reduced, and light is effectively blocked by the composite grid structure 216 from diffusing to adjacent photoelectric devices since there is no additional layer between the metal grid layer 228 and the dielectric grid layer 230. Accordingly, quantum efficiency of the semiconductor device 200 is increased due to a shorter path of the light while a crosstalk effect and an image quality of the semiconductor device 200 are greatly improved.

Figure 3C:
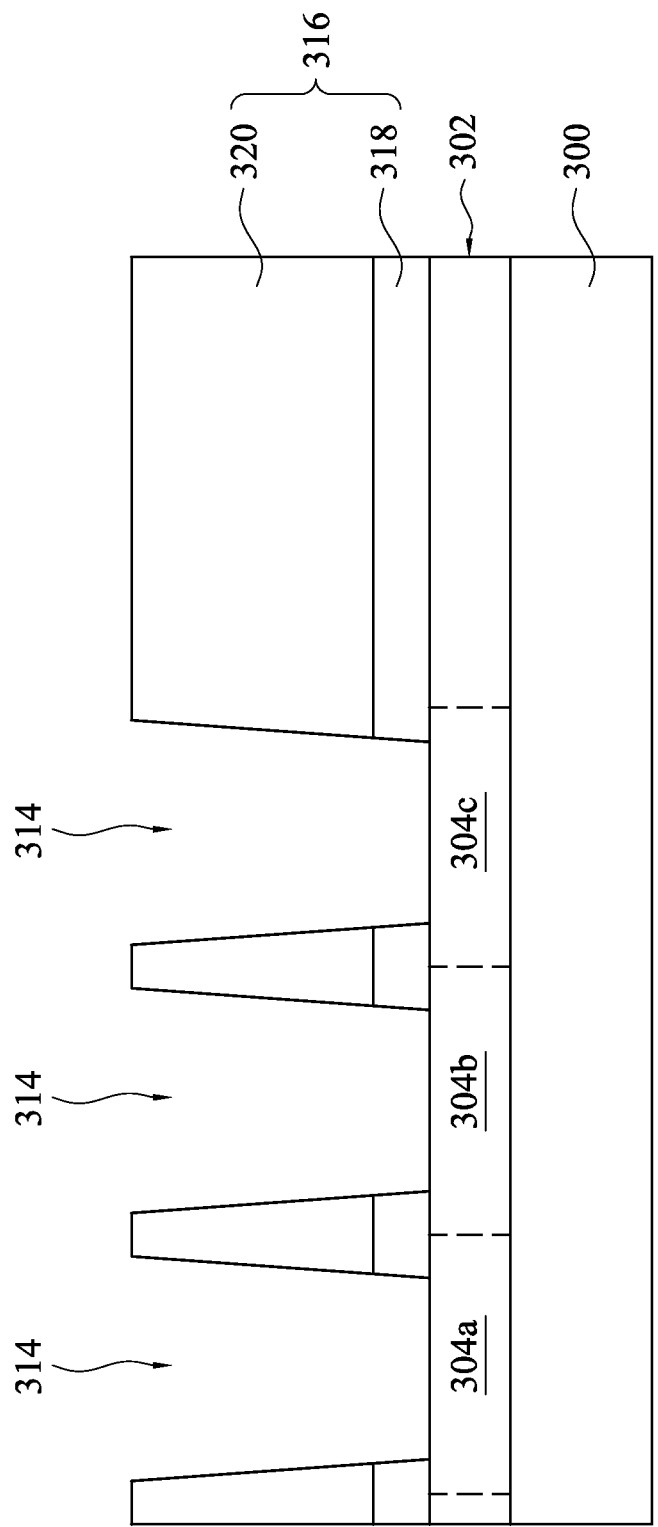

FIG. 3A through FIG. 3E are schematic cross-sectional views of intermediate stages showing a method for manufacturing a semiconductor device in accordance with various embodiments. As shown in FIG. 3A, a substrate 300 is provided. The substrate 300 is a semiconductor substrate, and may be composed of a single-crystalline semiconductor material or a compound semiconductor material. For example, silicon, germanium or glass may be used as a material of the substrate 300.

Referring to FIG. 3A again, a device layer 302 is formed on the substrate 300 by using, for example, a deposition technique, an epitaxial technique or a bonding technique. In some examples, the operation of forming the device layer 302 includes forming the device layer 302 from silicon. For example, the device layer 302 may be formed from epitaxial silicon. The device layer 302 is formed to include various photoelectric devices 304a, 304b and 304c. In some examples, the photoelectric devices 304a, 304b and 304c are photodiodes.

As shown in FIG. 3B, a composite structure 306 is formed on the device layer 302 and covers the photoelectric devices 304a, 304b and 304c. In some examples, the operation of forming the composite structure 306 is performed to form the composite structure 306 including a metal layer 308 and a dielectric layer 310 stacked on the device layer 302 sequentially. The metal layer 308 is formed from metal or a metal alloy, such as tungsten or an aluminum-copper alloy. The metal layer 308 may be formed by using, for example, a chemical vapor deposition (CVD) technique or a physical vapor deposition (PVD) technique. In some exemplary examples, the metal layer 308 is formed to have a thickness 312 ranging from about 500 angstrom to about 5000 angstrom. The dielectric layer 310 may be formed from silicon oxide, silicon nitride or silicon oxynitride, for example. The dielectric layer 310 may be formed by using, for example, a chemical vapor deposition technique.

Referring to FIG. 3B and FIG. 3C simultaneously, various cavities 314 are formed in the composite structure 306, so as to complete a composite grid structure 316, as shown in FIG. 3C. For example, the operation of forming the cavities 314 may be performed by using a photolithography technique and an etching technique. The operation of forming the cavities 314 includes removing a portion of the dielectric layer 310 and a portion of the metal layer 308 of the composite structure 306 to respectively form a dielectric grid layer 320 and a metal grid layer 318 and to expose a portion of the device layer 302. In some exemplary examples, the operation of removing the portion of the dielectric layer 310 and the portion of the metal layer 308 is performed by using one single etching process. The cavities 314 correspondingly expose the photoelectric devices 304a, 304b and 304c. The dielectric grid layer 320 is formed to stack on the metal grid layer 318 to form the composite grid structure 316. In some examples, as shown in FIG. 3C, each cavity 314 is formed to have a cross-section in a shape of trapezoid. In certain examples, each cavity 314 is formed to have a cross-section in a shape of rectangle. The cavities 314 may be periodically arranged.

Figure 3D:
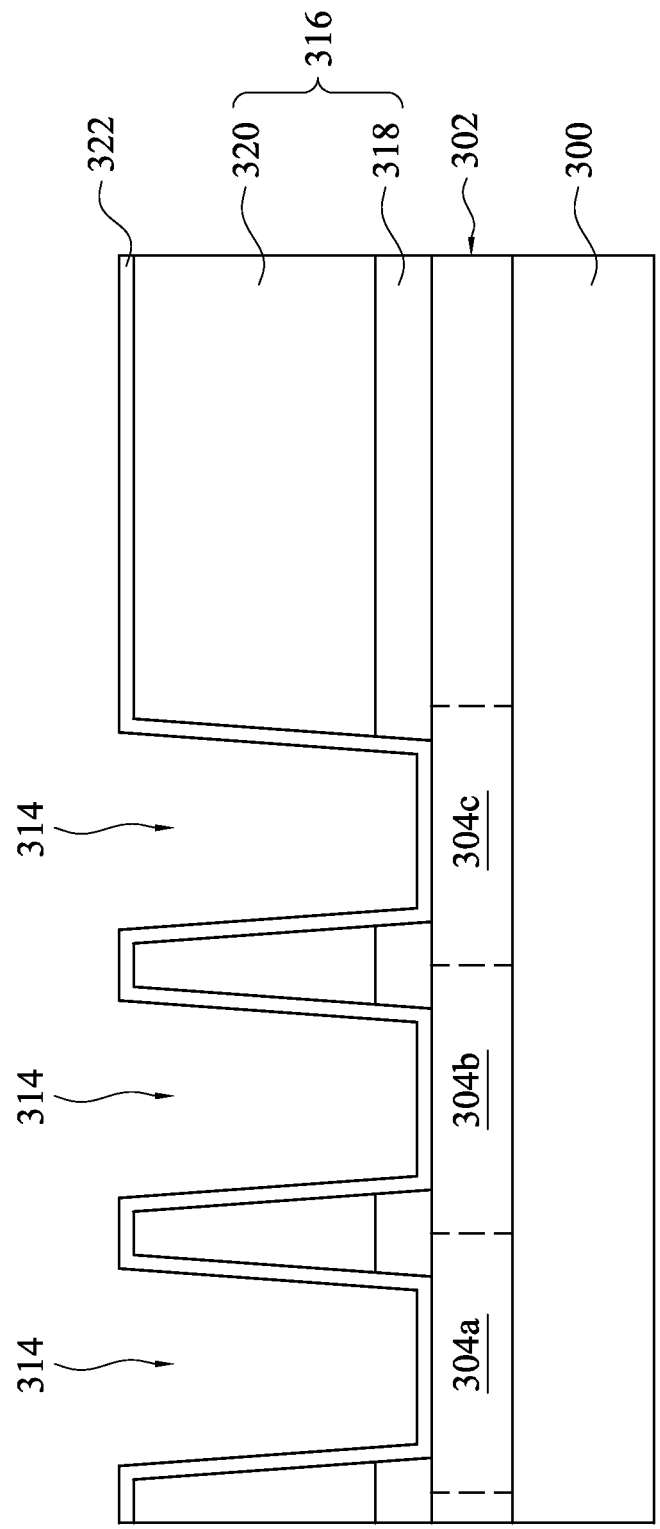

As shown in FIG. 3D, a passivation layer 322 is formed to conformally cover the composite grid structure 316, such that the passivation layer 322 is formed to cover the exposed portion of the device layer 302. The operation of forming the passivation layer 322 may be performed by using, for example, a chemical vapor deposition technique or a physical vapor deposition technique. In some examples, the passivation layer 322 is formed from silicon oxide, silicon nitride or silicon oxynitride.

Figure 3E:
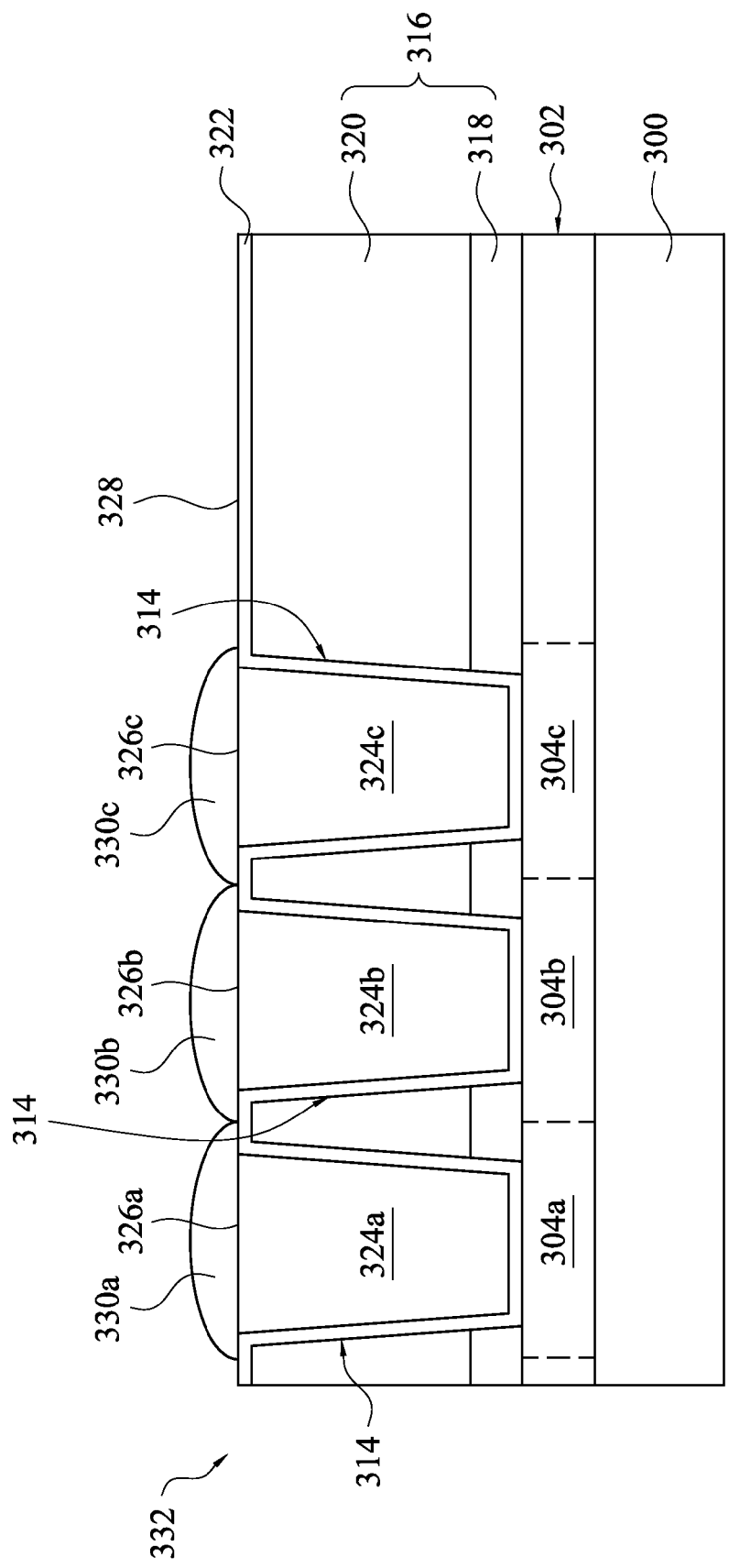

As shown in FIG. 3E, various color filters 324a, 324b and 324c are formed on the passivation layer 322 and respectively fill the cavities 314. The color filters 324a, 324b and 324c may be arranged sequentially. In some exemplary examples, the color filters 324a, 324b and 324c are formed to include red color filters, blue color filters and green color filters. In some examples, the operation of forming the color filters 324a, 324b and 324c is performed to form the color filters 324a, 324b and 324c respectively having top surfaces 326a, 326b and 326c, in which the top surfaces 326a, 326b and 326c are elevated at the same level with a top 328 of the passivation layer 322.

As shown in FIG. 3E, various micro lenses 330a, 330b and 330c may be optionally formed to cover the top surfaces 326a, 326b and 326c of the color filters 324a, 324b and 324c respectively, so as to complete a semiconductor device 332.

Figure 4:
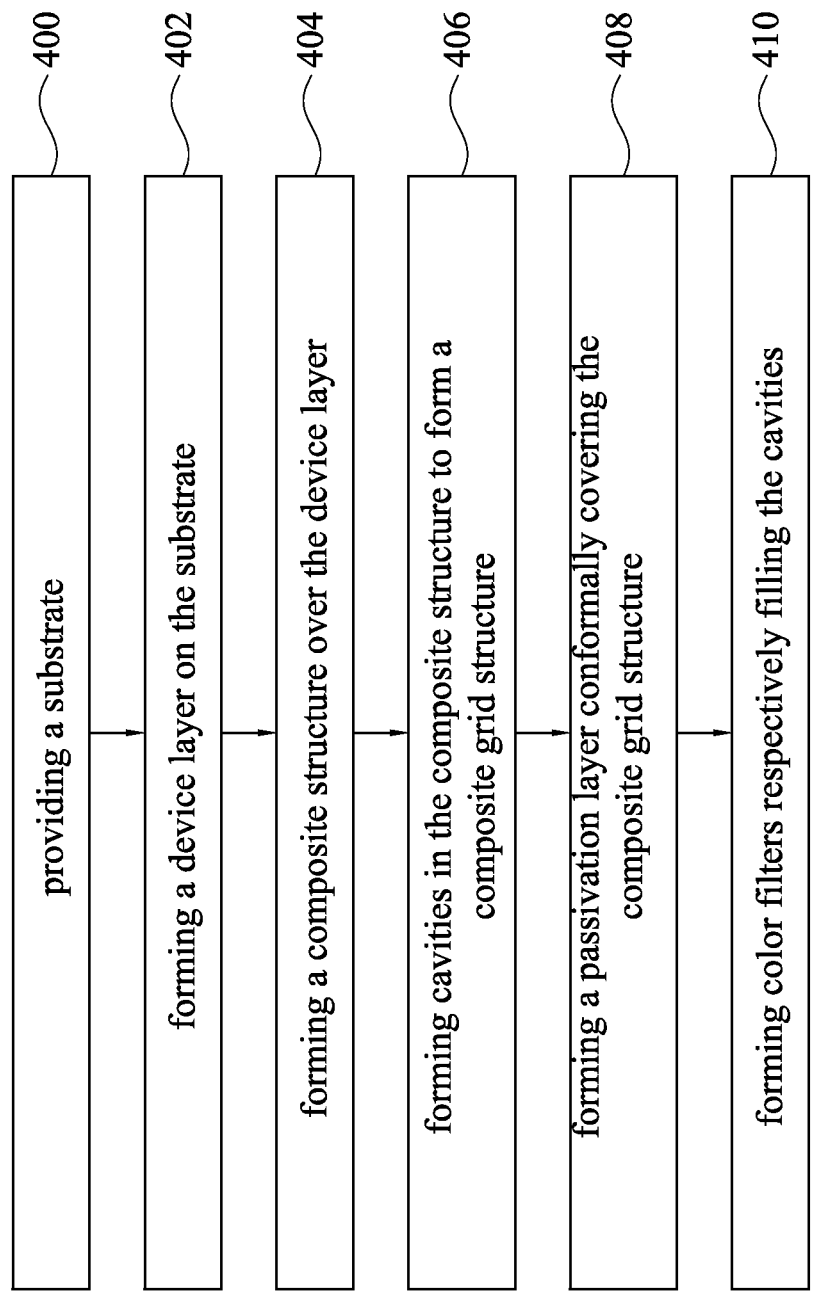
FIG. 4 is a flow chart of a method for manufacturing a semiconductor device in accordance with various embodiments.

Referring to FIG. 4 with FIG. 3A through FIG. 3E, FIG. 4 is a flow chart of a method for manufacturing a semiconductor device in accordance with various embodiments. The method begins at operation 400, where a substrate 300 is provided. At operation 402, a device layer 302 is formed on the substrate 300, as shown in FIG. 3A. The operation of forming the device layer 302 may be performed using, for example, a deposition technique, an epitaxial technique or a bonding technique. In some examples, the device layer 302 is formed to include various photoelectric devices 304a, 304b and 304c, such as photodiodes.

At operation 404, as shown in FIG. 3B, a composite structure 306 is formed on the device layer 302 and covers the photoelectric devices 304a, 304b and 304c. In some examples, the composite structure 306 is formed to include a metal layer 308 and a dielectric layer 310 stacked on the device layer 302 sequentially. The metal layer 308 may be formed by using, for example, a chemical vapor deposition technique or a physical vapor deposition technique. In some exemplary examples, the metal layer 308 is formed to have a thickness 312 ranging from about 500 angstrom to about 5000 angstrom. The dielectric layer 310 may be formed by using, for example, a chemical vapor deposition technique.

At operation 406, referring to FIG. 3B and FIG. 3C, a portion of the dielectric layer 310 and a portion of the metal layer 308 of the composite structure 306 are removed to form various cavities 314 in the composite structure 306, so as to complete a composite grid structure 316, as shown in FIG. 3C. The operation of forming the cavities 314 may be performed by using a photolithography technique and an etching technique. The portion of the dielectric layer 310 and the portion of the metal layer 308 may be removed to respectively form dielectric grid layer 320 and a metal grid layer 318 by using one single etching process. The cavities 314 are formed to correspondingly expose the photoelectric devices 304a, 304b and 304c. The dielectric grid layer 320 is formed to stack on the metal grid layer 318 to form the composite grid structure 316.

At operation 408, as shown in FIG. 3D, a passivation layer 322 is formed to conformally cover the composite grid structure 316 by using, for example, a chemical vapor deposition technique or a physical vapor deposition technique. The passivation layer 322 is formed to cover the exposed portion of the device layer 302.

At operation 410, as shown in FIG. 3E, various color filters 324a, 324b and 324c are formed on the passivation layer 322 and respectively fill the cavities 314. For example, the color filters 324a, 324b and 324c may be formed to include red color filters, blue color filters and green color filters. In some examples, the operation of forming the color filters 324a, 324b and 324c is performed to form the color filters 324a, 324b and 324c respectively having top surfaces 326a, 326b and 326c, in which the top surfaces 326a, 326b and 326c are elevated at the same level with a top 328 of the passivation layer 322. As shown in FIG. 3E, various micro lenses 330a, 330b and 330c may be optionally formed to cover the top surfaces 326a, 326b and 326c of the color filters 324a, 324b and 324c respectively, so as to complete a semiconductor device 332.

Figure 5A:
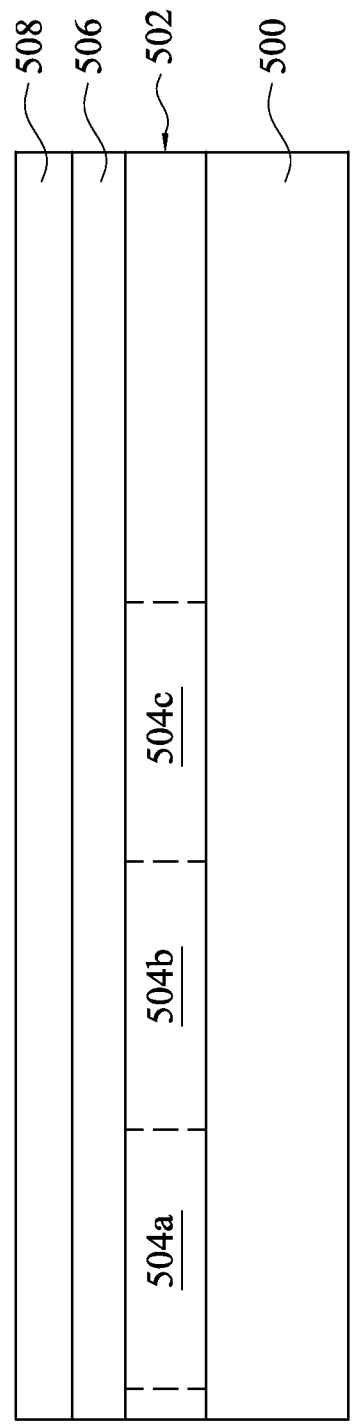
FIG. 5A through FIG. 5E are schematic cross-sectional views of intermediate stages showing a method for manufacturing a semiconductor device in accordance with various embodiments.

FIG. 5A through FIG. 5E are schematic cross-sectional views of intermediate stages showing a method for manufacturing a semiconductor device in accordance with various embodiments. As shown in FIG. 5A, a substrate 500 is provided. The substrate 500 is a semiconductor substrate, and may be composed of a single-crystalline semiconductor material or a compound semiconductor material. For example, silicon, germanium or glass may be used as a material of the substrate 300.

As shown in FIG. 5A, a device layer 502 is formed on the substrate 500 by using, for example, a deposition technique, an epitaxial technique or a bonding technique. In some examples, the operation of forming the device layer 502 includes forming the device layer 502 from silicon. For example, the device layer 502 may be formed from epitaxial silicon. The device layer 502 is formed to include various photoelectric devices 504a, 504b and 504c. In some examples, the photoelectric devices 504a, 504b and 504c are photodiodes.

Referring to FIG. 5A again, the anti-reflective coating layer 506 is formed on the device layer 502 and covering the photoelectric devices 504a, 504b and 504c by using, for example, a deposition technique. The anti-reflective coating layer 506 is suitable for use in increasing the incident amount of light. The buffer layer 508 is formed on the anti-reflective coating layer 506 by using, for example, a deposition technique. The buffer layer 508 is suitable for use in increasing the adhesion of the composite grid structure 520 and the color filters 528a, 528b and 528c (referring to FIG. 5E) to the device layer 502.

Figure 5B:
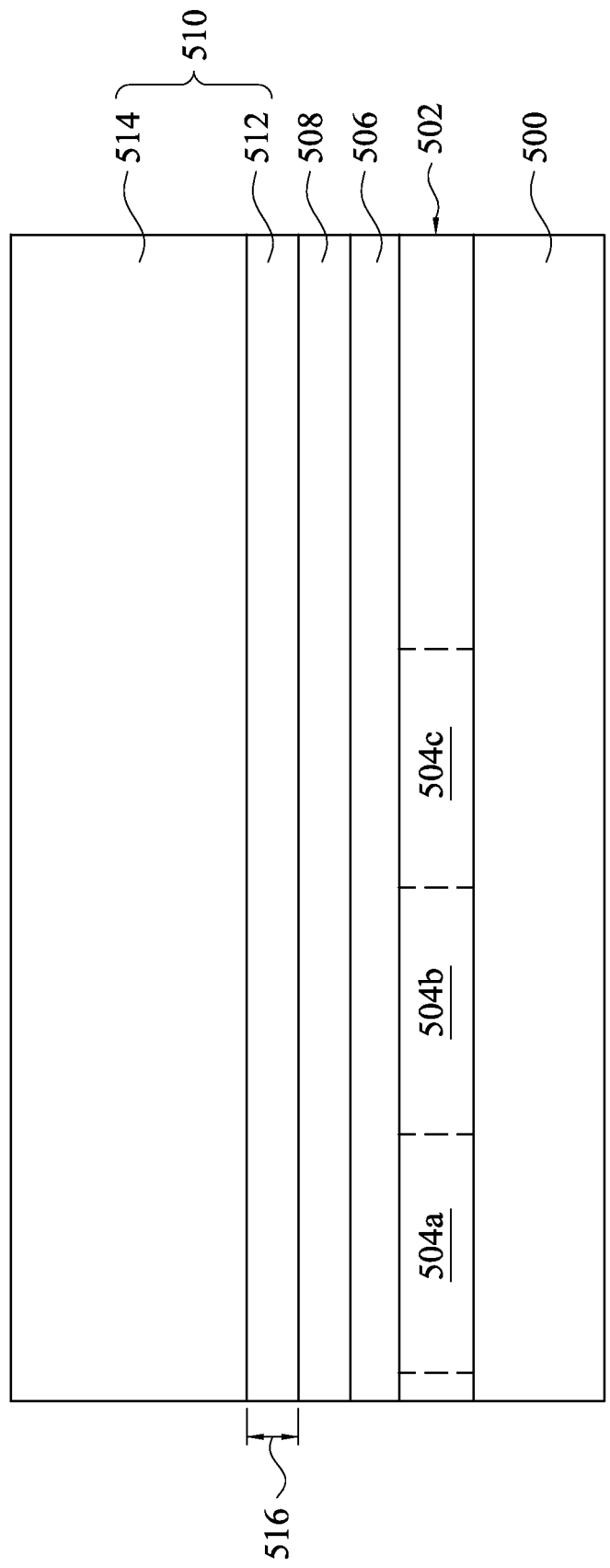

As shown in FIG. 5B, a composite structure 510 is formed on the buffer layer 508. In some examples, the operation of forming the composite structure 510 is performed to form the composite structure 510 including a metal layer 512 and a dielectric layer 514 stacked on the buffer layer 508 sequentially. The metal layer 512 is formed from metal or a metal alloy, such as tungsten or an aluminum-copper alloy. The metal layer 512 may be formed by using, for example, a chemical vapor deposition technique or a physical vapor deposition technique. In some exemplary examples, the metal layer 512 is formed to have a thickness 516 ranging from about 500 angstrom to about 5000 angstrom. The dielectric layer 514 may be formed from silicon oxide, silicon nitride or silicon oxynitride, for example. The dielectric layer 514 may be formed by using, for example, a chemical vapor deposition technique.

Figure 5C:
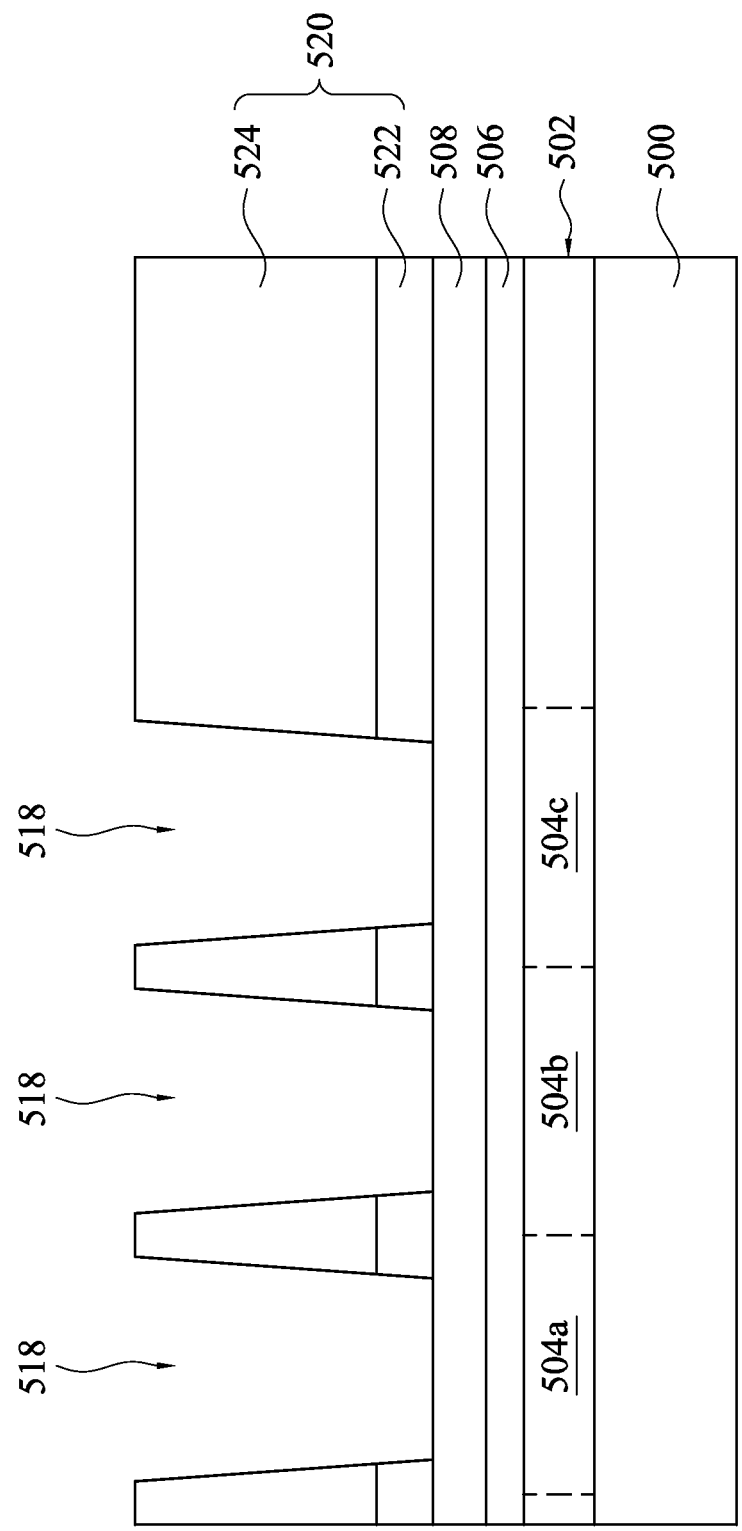

Referring to FIG. 5B and FIG. 5C simultaneously, various cavities 518 are formed in the composite structure 510 by removing a portion of the dielectric layer 514 and a portion of the metal layer 512, so as to complete a composite grid structure 520, as shown in FIG. 5C. For example, the operation of forming the cavities 518 may be performed by using a photolithography technique and an etching technique. The operation of removing the portion of the dielectric layer 514 and the portion of the metal layer 512 is performed to correspondingly form a dielectric grid layer 524 and a metal grid layer 522 and to expose a portion of the buffer layer 508. In some exemplary examples, the operation of removing the portion of the dielectric layer 514 and the portion of the metal layer 512 is performed by using one single etching process. The dielectric grid layer 524 is formed to stack on the metal grid layer 522 to form the composite grid structure 520. In some examples, as shown in FIG. 5C, each cavity 518 is formed to have a cross-section in a shape of trapezoid. In certain examples, each cavity 518 is formed to have a cross-section in a shape of rectangle. The cavities 518 may be periodically arranged.

Figure 5D:
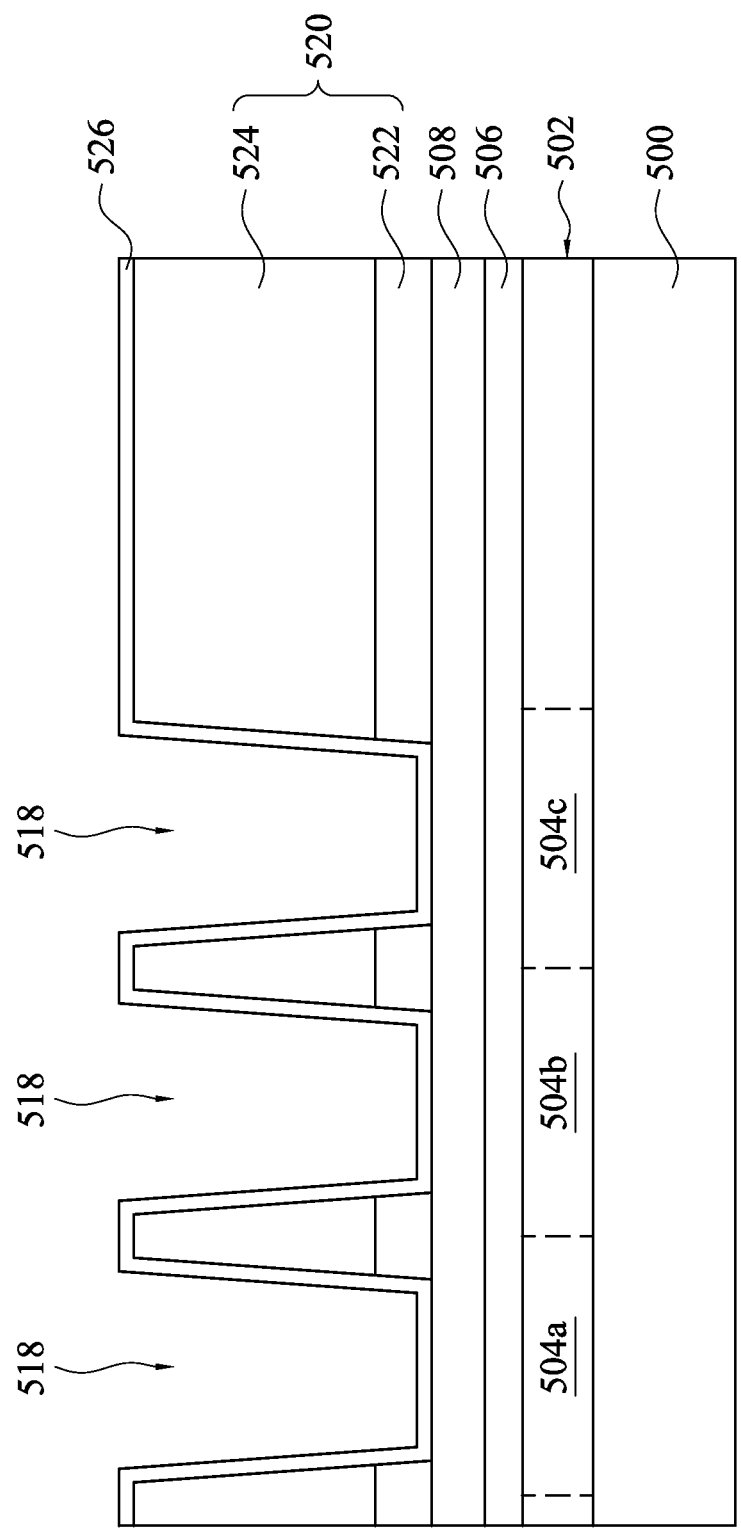

As shown in FIG. 5D, a passivation layer 526 is formed to conformally cover the composite grid structure 520, such that the passivation layer 526 is formed to cover the exposed portion of the buffer layer 508. The operation of forming the passivation layer 526 may be performed by using, for example, a chemical vapor deposition technique or a physical vapor deposition technique. In some examples, the passivation layer 526 is formed from silicon oxide, silicon nitride or silicon oxynitride.

Figure 5E:
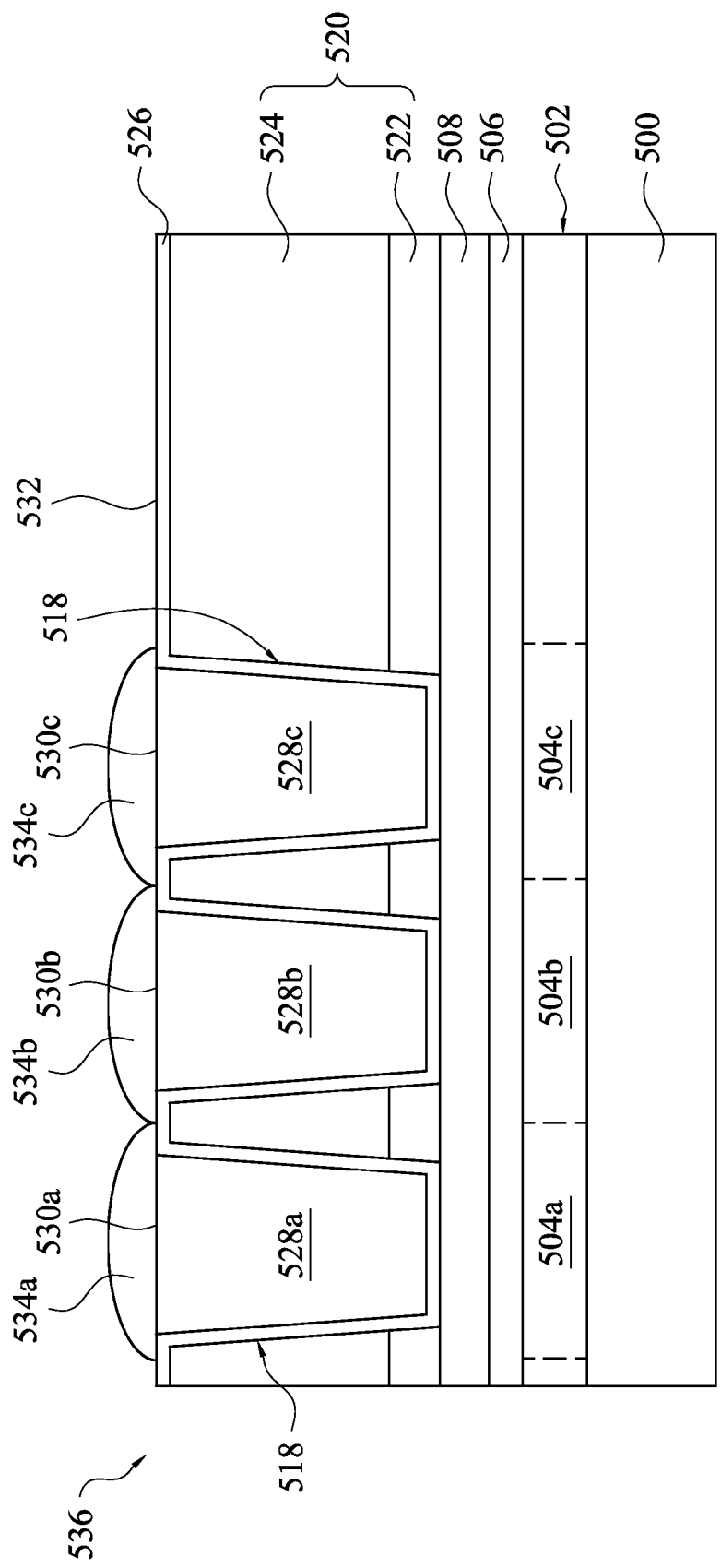

As shown in FIG. 5E, various color filters 528a, 528b and 528c are formed on the passivation layer 526 and respectively fill the cavities 518. The color filters 528a, 528b and 528c may be arranged sequentially. In some exemplary examples, the color filters 528a, 528b and 528c are formed to include red color filters, blue color filters and green color filters. In some examples, the operation of forming the color filters 528a, 528b and 528c is performed to form the color filters 528a, 528b and 528c respectively having top surfaces 530a, 530b and 530c, in which the top surfaces 530a, 530b and 530c are elevated at the same level with a top 532 of the passivation layer 526.

Referring to FIG. 5E again, various micro lenses 534a, 534b and 534c are formed to cover the top surfaces 530a, 530b and 530c of the color filters 528a, 528b and 528c respectively, so as to complete a semiconductor device 536.

Figure 6:
FIG. 6 is a flow chart of a method for manufacturing a semiconductor device in accordance with various embodiments.

Referring to FIG. 6 with FIG. 5A through FIG. 5E, FIG. 6 is a flow chart of a method for manufacturing a semiconductor device in accordance with various embodiments. The method begins at operation 600, where a substrate 500 is provided. At operation 602, a device layer 502 is formed on the substrate 500, as shown in FIG. 5A. The operation of forming the device layer 502 may be performed using, for example, a deposition technique, an epitaxial technique or a bonding technique. In some examples, the device layer 502 is formed to include various photoelectric devices 504a, 504b and 504c, such as photodiodes.

At operation 604, referring to FIG. 5A again, the anti-reflective coating layer 506 is formed on the device layer 502 and covering the photoelectric devices 504a, 504b and 504c by using, for example, a deposition technique. The anti-reflective coating layer 506 is suitable for use in increasing the incident amount of light. At operation 606, the buffer layer 508 is formed on the anti-reflective coating layer 506 by using, for example, a deposition technique. The buffer layer 508 is suitable for use in increasing the adhesion of the composite grid structure 520 and the color filters 528a, 528b and 528c (referring to FIG. 5E) to the device layer 502.

At operation 608, as shown in FIG. 5B, a composite structure 510 is formed on the buffer layer 508. In some examples, the operation of forming the composite structure 510 is performed to form the composite structure 510 including a metal layer 512 and a dielectric layer 514 stacked on the buffer layer 508 sequentially. The metal layer 512 may be formed by using, for example, a chemical vapor deposition technique or a physical vapor deposition technique. In some exemplary examples, the metal layer 512 is formed to have a thickness 516 ranging from about 500 angstrom to about 5000 angstrom. The dielectric layer 514 may be formed by using, for example, a chemical vapor deposition technique.

At operation 610, referring to FIG. 5B and FIG. 5C simultaneously, various cavities 518 are formed in the composite structure 510 by removing a portion of the dielectric layer 514 and a portion of the metal layer 512, so as to complete a composite grid structure 520, as shown in FIG. 5C. For example, the operation of forming the cavities 518 may be performed by using a photolithography technique and an etching technique. The operation of removing the portion of the dielectric layer 514 and the portion of the metal layer 512 is performed to correspondingly form a dielectric grid layer 524 and a metal grid layer 522 and to expose a portion of the buffer layer 508. In some exemplary examples, the operation of removing the portion of the dielectric layer 514 and the portion of the metal layer 512 is performed by using one single etching process. The dielectric grid layer 524 is formed to stack on the metal grid layer 522 to form the composite grid structure 520.

At operation 612, as shown in FIG. 5D, a passivation layer 526 is formed to conformally cover the composite grid structure 520. The passivation layer 526 further covers the exposed portion of the buffer layer 508. The operation of forming the passivation layer 526 may be performed by using, for example, a chemical vapor deposition technique or a physical vapor deposition technique.

At operation 614, as shown in FIG. 5E, various color filters 528a, 528b and 528c are formed on the passivation layer 526 and respectively fill the cavities 518. The color filters 528a, 528b and 528c may be arranged sequentially. In some exemplary examples, the color filters 528a, 528b and 528c are formed to include red color filters, blue color filters and green color filters. In some examples, the operation of forming the color filters 528a, 528b and 528c is performed to form the color filters 528a, 528b and 528c respectively having top surfaces 530a, 530b and 530c, in which the top surfaces 530a, 530b and 530c are elevated at the same level with a top 532 of the passivation layer 526.

At operation 616, referring to FIG. 5E again, various micro lenses 534a, 534b and 534c are formed to cover the top surfaces 530a, 530b and 530c of the color filters 528a, 528b and 528c respectively, so as to complete a semiconductor device 536.

In accordance with an embodiment, the present disclosure discloses a semiconductor device. The semiconductor device includes a substrate, a device layer, a composite grid structure, a passivation layer and color filters. The device layer overlies the substrate. The composite grid structure overlies the device layer. The composite grid structure includes cavities passing through the composite grid structure, and the composite grid structure includes a metal grid layer and a dielectric grid layer stacked on the metal grid layer. The passivation layer conformally covers the composite grid structure. The color filters respectively fill the cavities.

In accordance with another embodiment, the present disclosure discloses a semiconductor device. The semiconductor device includes a substrate, a device layer, an anti-reflective coating layer, a buffer layer, a composite grid structure, a passivation layer, color filters and micro lenses. The device layer is disposed on the substrate. The anti-reflective coating layer is disposed on the device layer. The buffer layer is disposed on the anti-reflective coating layer. The composite grid structure is disposed on the buffer layer. The composite grid structure includes cavities exposing a portion of the buffer layer, and the composite grid structure includes a metal grid layer and a dielectric grid layer sequentially stacked on the buffer layer. The passivation layer conformally covers the composite grid structure. The color filters respectively fill the cavities. The micro lenses respectively cover top surfaces of the color filters.

In accordance with yet another embodiment, the present disclosure discloses a method for manufacturing a semiconductor device. In this method, a substrate is provided. A device layer is formed on the substrate. A composite structure is formed over the device layer. The operation of forming the composite structure is performed to sequentially form a metal layer and a dielectric layer stacked on the device layer. Cavities are formed in the composite structure and pass through the composite structure, so as to form a composite grid structure. A passivation layer is formed to conformally cover the composite grid structure. Color filters are formed to respectively fill the cavities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   a substrate;
   a device layer overlying the substrate;
   a composite grid structure overlying the device layer, wherein the composite grid structure comprises a plurality of cavities passing through the composite grid structure, and the composite grid structure comprises a metal grid layer and a dielectric grid layer stacked on the metal grid layer;

a passivation layer conformally covering a top surface of the composite grid structure and side surfaces and bottom surfaces of the cavities; and a plurality of color filters respectively filling the cavities.

2. The semiconductor device of claim 1, wherein the metal grid layer is formed from tungsten or aluminum-copper alloy.

3. The semiconductor device of claim 1, wherein the metal grid layer has a thickness ranging from 500 angstrom to 5000 angstrom.

4. The semiconductor device of claim 1, wherein the dielectric grid layer is formed from silicon oxide, silicon nitride, or silicon oxynitride.

5. The semiconductor device of claim 1, further comprising an anti-reflective coating layer disposed between the device layer and the metal grid layer.

6. The semiconductor device of claim 1, further comprising a buffer layer disposed between the device layer and the metal grid layer.

7. The semiconductor device of claim 1, further comprising a plurality of micro lenses respectively covering top surfaces of the color filters.

8. The semiconductor device of claim 1, wherein top surfaces of the color filters are elevated at the same level with a top of the passivation layer.

9. A semiconductor device, comprising:
a substrate;
a device layer disposed on the substrate;
an anti-reflective coating layer disposed on the device layer;
a buffer layer disposed on the anti-reflective coating layer;
a composite grid structure disposed on the buffer layer, wherein the composite grid structure comprises a plurality of cavities exposing a portion of the buffer layer, and the composite grid structure comprises a metal grid layer and a dielectric grid layer sequentially stacked on the buffer layer;
a passivation layer conformally covering a top surface of the composite grid structure and side surfaces and bottom surfaces of the cavities;
a plurality of color filters respectively filling the cavities; and
a plurality of micro lenses respectively covering top surfaces of the color filters.

10. The semiconductor device of claim 9, wherein the metal grid layer has a thickness ranging from 500 angstrom to 5000 angstrom.

11. The semiconductor device of claim 9, wherein the metal grid layer is formed from tungsten or aluminum-copper alloy.

12. The semiconductor device of claim 9, wherein the dielectric grid layer is formed from silicon oxide, silicon nitride, or silicon oxynitride.

13. The semiconductor device of claim 9, wherein the top surfaces of the color filters are elevated at the same level with a top of the passivation layer.

14. A method for manufacturing a semiconductor device, the method comprising:
providing a substrate;
forming a device layer on the substrate;
forming a composite structure over the device layer, wherein the forming of the composite structure is performed to sequentially form a metal layer and a dielectric layer stacked on the device layer;
forming a plurality of cavities in the composite structure and passing through the composite structure, so as to form a composite grid structure;
forming a passivation layer conformally covering a top surface of the composite grid structure and side surfaces and bottom surfaces of the cavities; and
forming a plurality of color filters respectively filling the cavities such that the color filters are located on the passivation layer in the cavities.

15. The method of claim 14, wherein the forming of the metal layer comprises forming the metal layer from tungsten or aluminum-copper alloy.

16. The method of claim 14, wherein the forming of the metal layer comprises forming the metal layer having a thickness ranging from 500 angstrom to 5000 angstrom.

17. The method of claim 14, wherein the forming of the dielectric layer comprises forming the dielectric layer from silicon oxide, silicon nitride, or silicon oxynitride.

18. The method of claim 14, wherein the forming of the cavities comprises removing a portion of the dielectric layer and a portion of the metal layer by using one single etching process.

19. The method of claim 14, wherein the forming of the color filters is performed to form the color filters having top surfaces which are elevated at the same level with a top of the passivation layer.

20. The method of claim 14, further comprising:
forming an anti-reflective coating layer on the device layer between the forming of the device layer and the forming of the composite structure;
forming a buffer layer on the anti-reflective coating layer between the forming of the anti-reflective coating layer and the forming of the composite structure; and
forming a plurality of micro lenses respectively covering top surfaces of the color filters after the forming of the color filters.

* * * * *